United States Patent
Tsai et al.

(10) Patent No.: US 7,436,526 B2
(45) Date of Patent: Oct. 14, 2008

(54) REAL-TIME SYSTEM FOR MONITORING AND CONTROLLING FILM UNIFORMITY AND METHOD OF APPLYING THE SAME

(75) Inventors: Wen-Li Tsai, Kaohsiung County (TW); Yu-Min Tsai, Taichung County (TW); Hsiao-Che Wu, Taoyuan Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 11/669,165

(22) Filed: Jan. 31, 2007

(65) Prior Publication Data
US 2008/0118631 A1    May 22, 2008

(30) Foreign Application Priority Data
Nov. 21, 2006    (TW)    ............................... 95142967 A

(51) Int. Cl.
| | |
|---|---|
| *B29C 65/00* | (2006.01) |
| *B29C 65/02* | (2006.01) |
| *B32B 37/00* | (2006.01) |
| *B32B 38/00* | (2006.01) |
| *C23C 16/52* | (2006.01) |
| *C23C 14/54* | (2006.01) |
| *G01B 11/14* | (2006.01) |
| *G01B 11/28* | (2006.01) |

(52) U.S. Cl. .............................. 356/630; 156/64; 427/8; 427/9; 356/625

(58) Field of Classification Search .................... 156/64; 356/600–640; 427/248.1
See application file for complete search history.

(56) References Cited

U.S. PATENT DOCUMENTS

| | | | |
|---|---|---|---|
| 4,545,646 A * | 10/1985 | Chern et al. ................ 359/569 |
| 4,618,262 A | 10/1986 | Maydan et al. | |
| 5,450,205 A | 9/1995 | Sawin et al. | |
| 5,559,428 A * | 9/1996 | Li et al. ..................... 324/71.5 |
| 5,612,887 A | 3/1997 | Laube et al. | |
| 5,660,672 A * | 8/1997 | Li et al. ................ 156/345.13 |
| 5,754,297 A * | 5/1998 | Nulman ..................... 356/630 |
| 6,072,313 A | 6/2000 | Li et al. | |
| 6,563,578 B2 * | 5/2003 | Halliyal et al. .......... 356/237.4 |
| 6,669,824 B2 | 12/2003 | Sferlazzo et al. | |
| 6,762,849 B1 * | 7/2004 | Rulkens ..................... 356/630 |
| 6,837,978 B1 * | 1/2005 | Hey et al. ..................... 205/84 |
| 7,095,511 B2 | 8/2006 | Chalmers et al. | |
| 2002/0142493 A1 * | 10/2002 | Halliyal et al. ................ 438/14 |

* cited by examiner

*Primary Examiner*—L. G. Lauchman
*Assistant Examiner*—Jarreas C Underwood
(74) *Attorney, Agent, or Firm*—Jianq Chyun IP Office

(57) ABSTRACT

A real-time system adapted to a PVD apparatus for monitoring and controlling film uniformity is described. The system includes a shielding plate, a monitoring device, and a data processing program. The shielding plate is disposed on an inner wall of a reaction chamber above a wafer stage. An opening in the center of the shielding plate exposes the wafer. The monitoring device including a scanner and a sensor respectively disposed on opposite sidewalls of the reaction chamber between the shielding plate and the wafer stage is used for measuring the flux of the particles on every portion of the wafer to acquire real-time uniformity data including a function of the wafer position and the flux. The data processing program compares the real-time uniformity data and reference uniformity data, and a feedback signal is outputted to the PVD apparatus to adjust the process parameter thereof for controlling film uniformity.

20 Claims, 6 Drawing Sheets

REAL-TIME SYSTEM FOR MONITORING AND CONTROLLING FILM UNIFORMITY AND METHOD OF APPLYING THE SAME

CROSS-REFERENCE TO RELATED APPLICATION

This application claims the priority benefit of Taiwan application serial no. 95142967, filed Nov. 21, 2006. All disclosure of the Taiwan application is incorporated herein by reference.

BACKGROUND OF THE INVENTION

1. Field of the Invention

The present invention relates to a system and a method for monitoring and controlling semiconductor process, and more particularly to a real-time system for monitoring and controlling film uniformity and a method of applying the same.

2. Description of Related Art

With the advances in semiconductor industry, integrated circuits develop towards miniature and high performance. To meet the requirements for high integration and great performance, a multi-layer design is adopted. Owing to distinct film thickness and electrical characteristics of devices, each film functions in a different manner. Specifically, the surface profile of the film on a wafer poses great impact on subsequent processes, such as a chemical mechanical polishing (CMP) process, a photolithography and etching process, and so on. Thus, it is always a dominant concern for the industry to determine how to accurately measure the thickness and uniformity of the film.

In general, the method for measuring the thickness of the film includes interferometry, scattering measurement and reflectometry. U.S. Pat. No. 5,450,205 provides an apparatus for measuring the thickness as well as the change in the thickness and a method using the same. As the film is etched or deposited, a charge couple device (CCD) camera is utilized to perform interferometry so as to measure the thickness and etching/depositing uniformity of the film on the wafer through a viewport with a certain size.

However, the viewport on the reaction chamber is required in said method for adopting the CCD camera. Moreover, the CCD camera is easily interfered by noises resulting from light generated by plasma within the reaction chamber and collects few signals, leading to less variation in the signals and insufficient sensitivity. In consequence, the film profile cannot be accurately measured. In addition, a high-coherence point light source e.g. a laser beam is required in said conventional method performing interferometry. Nevertheless, since the wafer occupies a large area, the thickness of every portion of the wafer cannot be timely measured through the point light source in a short period of time, and the measurement at many points has to be performed simultaneously, which brings about high operation complexity.

SUMMARY OF THE INVENTION

Accordingly, the present invention provides a real-time system for monitoring and controlling film uniformity. Since the installation and the operation of the system are quite simple, the system can be effectively applied to various physical vapor deposition (PVD) apparatuses.

The present invention further provides a method of applying the real-time system for monitoring and controlling film uniformity. The method is capable of rapidly and accurately measuring film thickness and uniformity and of timely adjusting a deposition process parameter.

The present invention provides a real-time system for monitoring and controlling film uniformity. The system is adapted to a PVD apparatus including a reaction chamber and a wafer stage used to carry a wafer. The system includes a shielding plate, a monitoring device, and a data processing program. The shielding plate is disposed on an inner wall of the reaction chamber above the wafer stage, and an opening in the center of the shielding plate exposes the wafer. Particles generated by the PVD apparatus pass through the opening and form a film on the wafer. The monitoring device includes a scanner and a sensor respectively disposed on opposite sidewalls of the reaction chamber between the shielding plate and the wafer stage. Said monitoring device is used to measure the flux of the particle on every portion of the wafer so as to acquire real-time uniformity data including a function of the wafer position and the flux. The data processing program is used to compare the real-time uniformity data and reference uniformity data and output a feedback signal to the PVD apparatus so as to adjust the process parameter thereof.

According to one embodiment of the present invention, the sensor detects absorption of the particles such that the flux is measured.

According to one embodiment of the present invention, the real-time uniformity data includes a function of the wafer position and the absorption.

According to one embodiment of the present invention, the scanner moves along a horizontal direction parallel to the wafer surface.

According to one embodiment of the present invention, the scanner includes an array light source.

According to one embodiment of the present invention, the monitoring device is arranged in a two-dimensional array and is disposed on a horizontal surface parallel to the wafer surface.

According to one embodiment of the present invention, the scanner outputs a collimated ray beam.

According to one embodiment of the present invention, the shielding plate shields the particles which are not deposited on the wafer.

According to one embodiment of the present invention, the PVD apparatus includes a double-ring electromagnetic controlling system.

According to one embodiment of the present invention, the PVD apparatus includes a magnetic coil.

The present invention provides a method of applying the real-time system for monitoring and controlling film uniformity. The method which can be applied to a PVD process includes synchronically measuring the flux of the particles on every portion of the wafer with use of the real-time system for monitoring and controlling film uniformity and acquiring the real-time uniformity data. From the total flux, a depositing rate of the film can be obtained. Next, the data processing program is executed to compare the real-time uniformity data and the reference uniformity data. Thereafter, a feedback signal is outputted to the PVD apparatus so as to adjust the process parameter thereof.

According to one embodiment of the present invention, the method of measuring the flux of the particles includes outputting a ray beam passing through the particles from the scanner and detecting absorption of the particles from the sensor, such that the flux can be measured.

According to one embodiment of the present invention, the real-time uniformity data includes a function of the wafer position and the absorption.

According to one embodiment of the present invention, the method of applying the real-time system for monitoring and controlling film uniformity further includes initiating a relative motion between the scanner and the wafer along a horizontal direction. The horizontal direction is parallel to the wafer surface.

According to one embodiment of the present invention, the scanner includes an array light source.

According to one embodiment of the present invention, the monitoring device is arranged in a two-dimensional array and is disposed on a horizontal surface parallel to the wafer surface.

According to one embodiment of the present invention, the scanner outputs a collimated ray beam.

According to one embodiment of the present invention, the shielding plate shields the particles which are not deposited on the wafer during the PVD process.

According to one embodiment of the present invention, the PVD apparatus includes a double-ring electromagnetic controlling system.

According to one embodiment of the present invention, the process parameter of the PVD apparatus is adjusted so as to adjust the flux of the particles on every portion of the wafer.

The present invention provides the real-time system for monitoring and controlling film uniformity and the method applying the same. The method is capable of accurately measuring the thickness of the film on every portion of the wafer during the PVD process, of comparing the measured data and the reference data, and of outputting the feedback signal to the PVD apparatus to adjust the process parameter thereof. Thereby, the monitoring and controlling of the film profile can be accomplished in real time.

In order to make the above and other objects, features and advantages of the present invention more comprehensible, several embodiments accompanied with figures are described in detail below.

DESCRIPTION OF EMBODIMENTS

Figure 1:
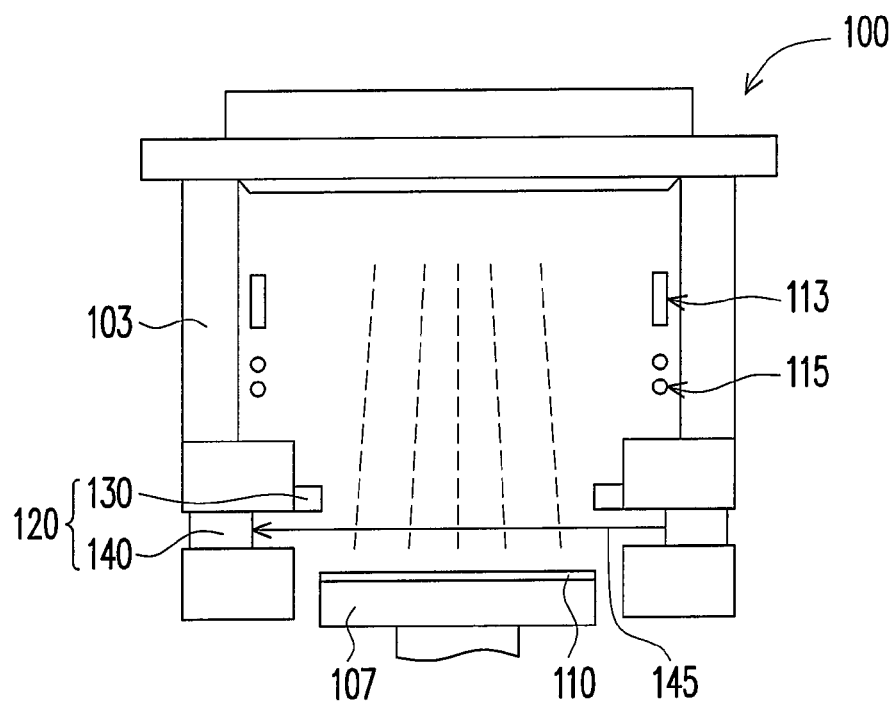
FIG. 1 is a schematic view depicting a PVD apparatus having a real-time system for monitoring and controlling film uniformity according to an embodiment of the present invention.
Figure 2:
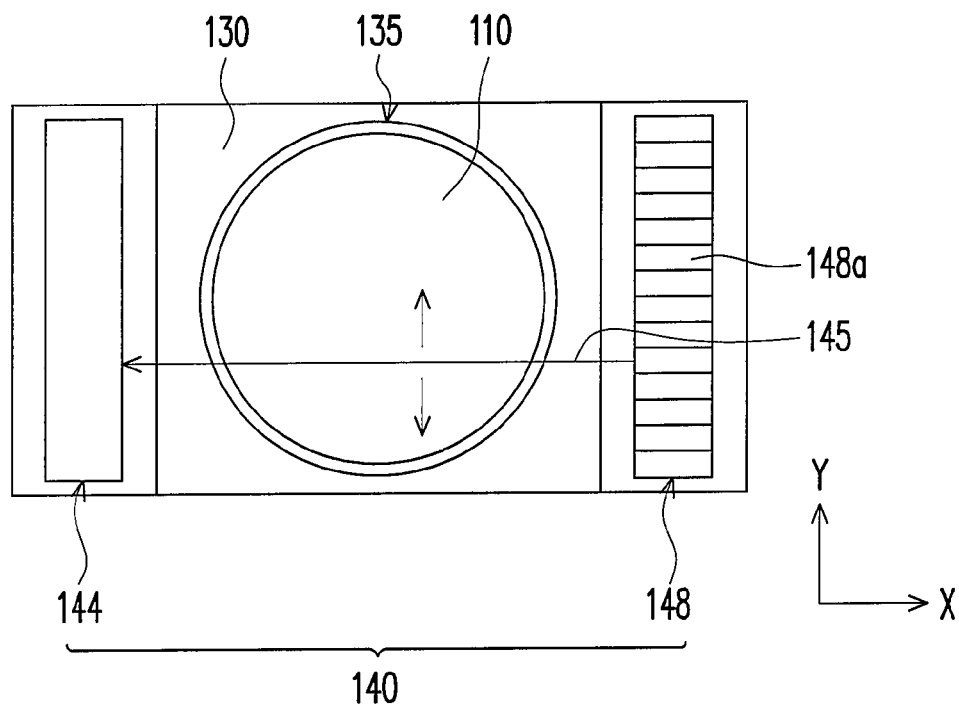
FIG. 2 is a top view depicting a reaction chamber in FIG. 1.
Figure 3:
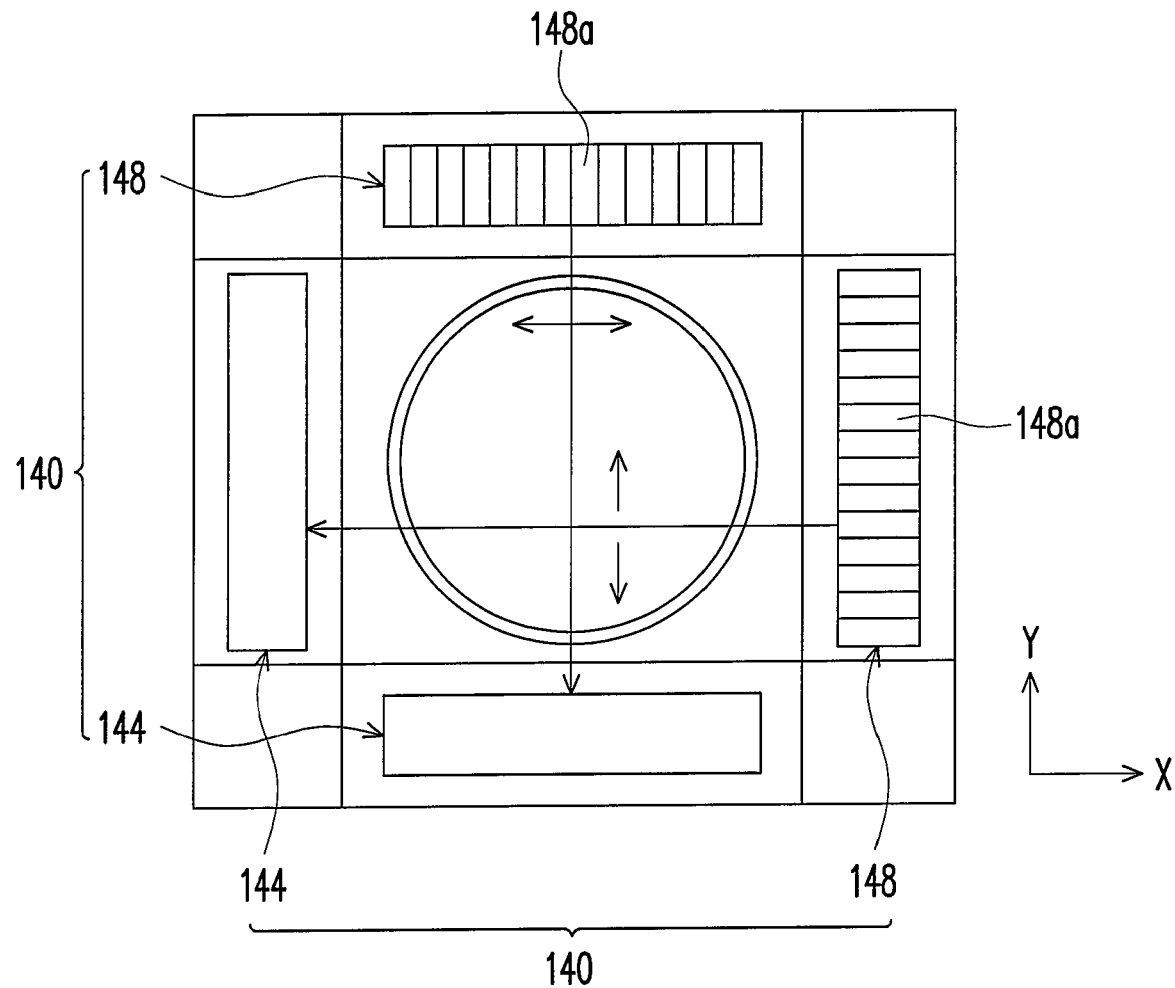
FIG. 3 is a top view depicting the reaction chamber according to another embodiment.
Figure 4A:
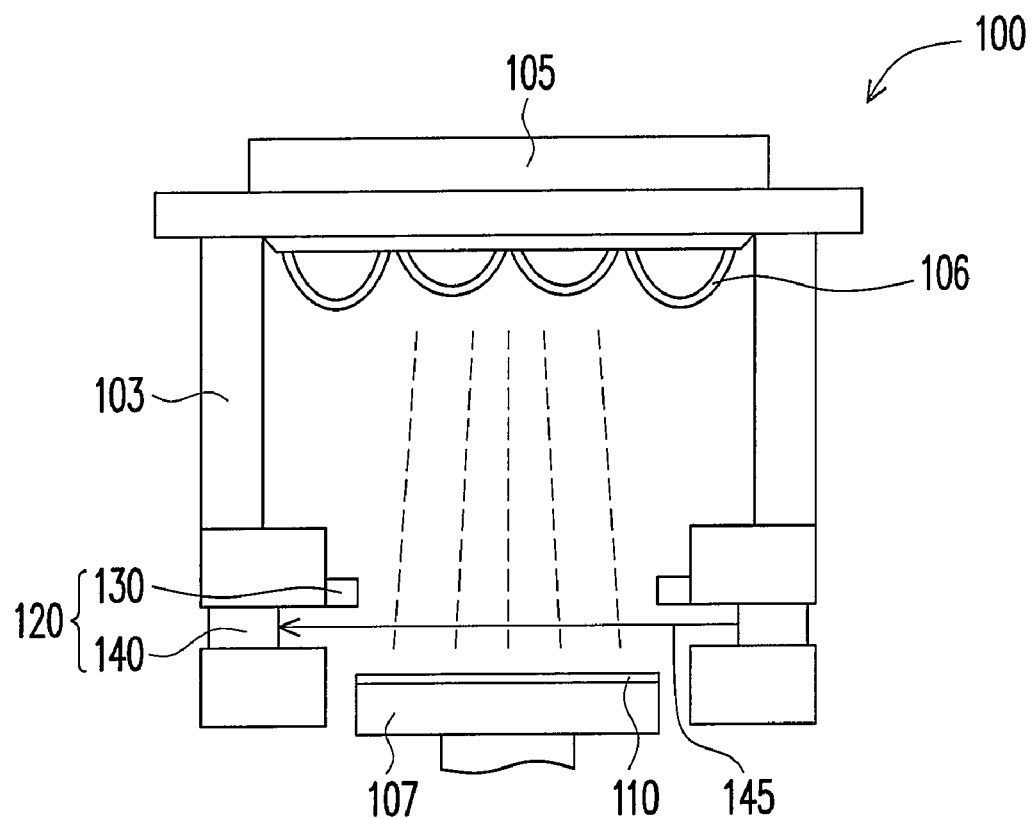
FIG. 4A is a schematic view depicting the PVD apparatus having a real-time system for monitoring and controlling film uniformity according to another embodiment of the present invention.
Figure 4B:
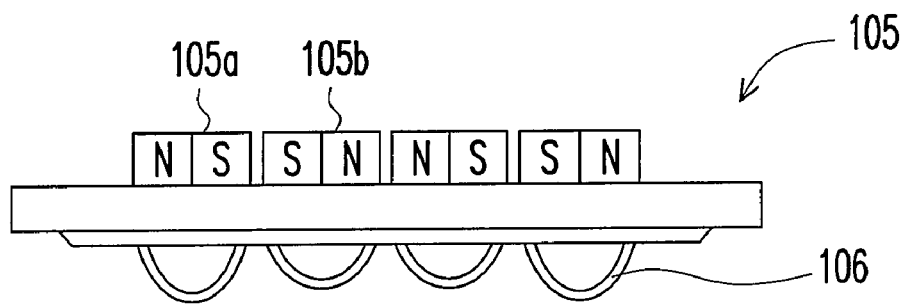
FIG. 4B is an enlarged partial view of FIG. 4A.

FIG. 1 is a schematic view depicting a PVD apparatus having a real-time system for monitoring and controlling film uniformity according to an embodiment of the present invention. FIG. 2 is a top view depicting a reaction chamber in FIG. 1. FIG. 3 is a top view depicting the reaction chamber of FIG. 1 according to another embodiment. FIG. 4A is a schematic view depicting the PVD apparatus having a real-time system for monitoring and controlling film uniformity according to another embodiment of the present invention. FIG. 4B is an enlarged partial view of FIG. 4A.

Please refer to FIGS. 1 and 2. In the present embodiment, the real-time system for monitoring and controlling film uniformity is adapted to the PVD apparatus. The PVD apparatus includes a reaction chamber 103 and a wafer stage 107 used to carry a wafer 110. In the present embodiment, an inductive coil 113 and a magnetic coil 115 are disposed on a sidewall of the PVD apparatus 100, for example.

The real-time system 120 for monitoring and controlling film uniformity includes a shielding plate 130, a monitoring device 140, and a data processing program. The shielding plate 130 is disposed on an inner wall of the reaction chamber 103 above the wafer stage 107. An opening 135 in the center of the shielding plate 130 exposes the wafer 110. Particles generated by the PVD apparatus pass through the opening 135 and form a film on the wafer 110 (not shown). Here, the particles are, for example, clusters composed of ions, atoms, and radicals produced by bombarding a target. The material of the shielding plate 130 is, for example, metal or ceramic. The disposition of the shielding plate 130 shields the particles which are not deposited on the wafer surface, and thus prevents the pollution caused by the particles in the subsequent deposition process. Further, in the present embodiment, it can be ensured that the later-measured flux of the particles is the amount of the particles deposited on the wafer 110.

The monitoring device 140 is disposed on the sidewall of the reaction chamber 103 between the shielding plate 130 and the wafer stage 107. The monitoring device 140 includes a scanner 148 and a sensor 144, for example. The scanner 148 and the sensor 144 are respectively disposed on the opposite sidewalls of the reaction chamber 103. A ray beam 145 outputted by the scanner 148 crosses the transmission direction of the particles. As the particles pass through the ray beam 145, a scattering effect is generated, the intensity of the ray beam 145 is reduced, and the intensity of the ray beam 145 detected by the sensor is also brought down. Thereby, the flux of the particles can be obtained from the absorption thereof. The absorption at different positions depends on different scanned cross-section areas. The light source of the scanner 148 can be a collimated ray beam e.g. a laser beam or others. However, since the sensor is not adopted to detect an interference phenomenon, the light source is not limited to the laser beam or to the lights with high coherence.

Figure 6:
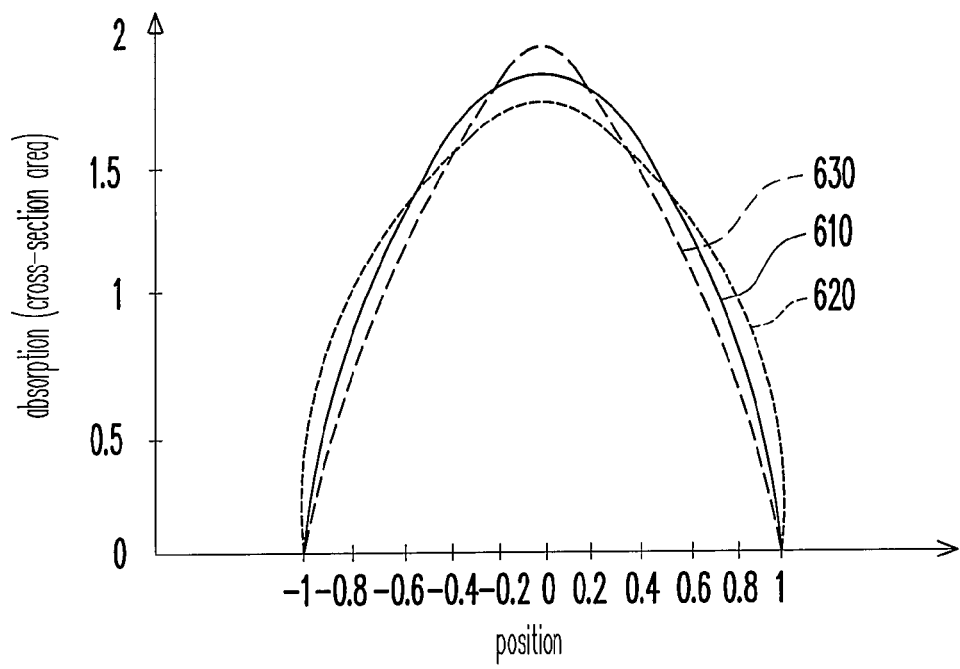
FIG. 6 is a diagram depicting the relation between a wafer position and absorption according to an embodiment of the present invention.

The scanner 148, for example, moves along a horizontal direction parallel to the wafer surface and scans the whole wafer 110. Thereby, the flux of the particles on every portion of the wafer 110 can be measured, and the real-time uniformity data can be further acquired. In the present embodiment, the relation between the wafer position and absorption is depicted in FIG. 6, and a function of the wafer position and the absorption is taught.

The scanner 148 may have an array light source including a plurality of light sources 148a in FIG. 2. Each of the light sources moves along a horizontal direction within a small range, and thus the flux of the particles on every portion of the wafer 110 can be obtained in real time In one embodiment, to measure the flux of the particles on every portion of the wafer 110 to a more accurate extent, the monitoring device 140 is arranged in a two-dimensional array and disposed on a horizontal surface parallel to the wafer surface, as indicated in FIG. 3. The scanners 148 are positioned in both the X and the Y directions, and the sensor 144 is disposed on opposite sides of the scanner 148 to measure the absorption. Certainly, the scanners 148 in said directions also include the array light source 148a which moves and scans along different directions.

In addition to the shielding plate 130 and the monitoring device 140, the real-time system 120 for monitoring and controlling includes the data processing program which is utilized to compare the real-time uniformity data and the reference uniformity data, so that a preferred process parameter can be calculated according to a desirable film profile. Aside from the above, a feedback signal is outputted to the PVD apparatus 100 so as to adjust the process parameter thereof. In the present embodiment, the feedback signal is, for example, transmitted to the magnetic coil 115. Thereby, the flux of the cluster on every portion of the wafer 110 is altered, and the film with a predetermined profile is formed.

The PVD apparatus 100 is not limited to said ionized PVD apparatus. Please refer to FIGS. 4A and 4B. In one embodiment, the PVD apparatus 100 includes a double-ring electromagnetic controlling system 105. The arc ring line 106 at the bottom of the double-ring electromagnetic controlling system 105 represents a distribution of magnetic lines. The feedback signal is transmitted to the double-ring electromagnetic controlling system 105, for example. Through an adjustment of an outer electromagnetic system 105a and an inner electromagnetic system 105b, the plasma density and the flux of the particles are under control.

In said embodiment, owing to the disposition of the scanner of the monitoring device, the system for monitoring and controlling film uniformity is capable of scanning the flux of the particles on every portion of the wafer in real time. Thereby, the uniformity data and the film profile are obtained. Besides, the disposition of the shielding plate prevents the monitoring device from detecting the particles which are not deposited on the wafer surface, thus ensuring the effectiveness of the measurement.

Moreover, due to simple composition of said system for monitoring and controlling film uniformity, the system can be easily applied to the PVD apparatus. The measurement of the film thickness in the system is performed by measuring the absorption instead of conducting the interferometry. Thus, the light source is not limited to the light with same coherence.

Figure 5:
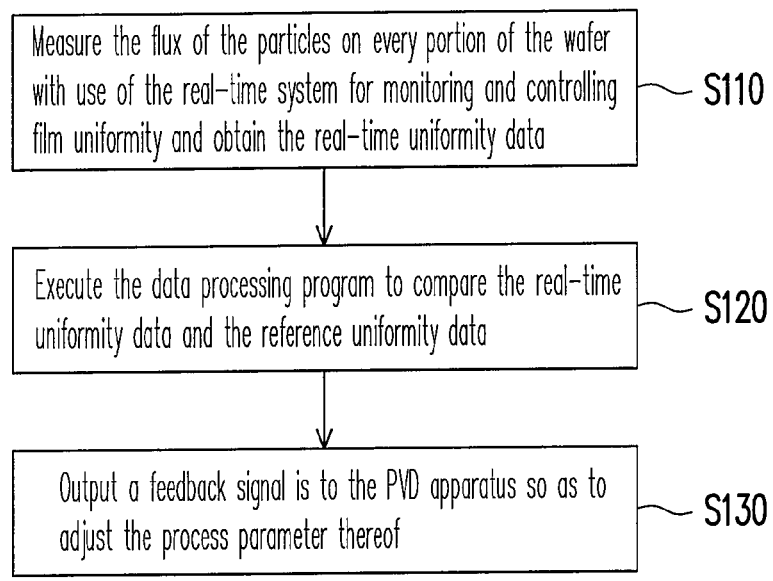
FIG. 5 is a flow chart depicting a method of applying the real-time system for monitoring and controlling film uniformity according to an embodiment of the present invention.

The method of applying the real-time system for monitoring and controlling film uniformity is illustrated hereinafter. FIG. 5 is a flow chart depicting a method of applying the real-time system for monitoring and controlling film uniformity according to an embodiment of the present invention. FIG. 6 is a diagram depicting the relation between a wafer position and absorption according to an embodiment of the present invention. FIGS. 7A-7D are schematic views depicting a simulation calculation according to an embodiment of the present invention.

Please refer to FIG. 5. In the present embodiment, the method of applying the real-time system for monitoring and controlling film uniformity is performed through said system in the PVD process. First, the flux of the particles on every portion of the wafer is synchronically measured with use of the real-time system for monitoring and controlling film uniformity, and the real-time uniformity data (S110) is obtained.

In the present embodiment, the PVD apparatus 100 is indicated in FIGS. 1 and 2, for example. And the method of measuring the flux of the particles includes outputting a ray beam passing through the particles from the scanner 148 and detecting the absorption of the particles from the sensor 144, such that the flux can be measured. The sensor 144 detects the intensity of the ray beam first, and measures the absorption of the particles according to the intensity of the outputted ray beam. The more the absorption is, the more the flux of the particles is. The absorption obtained by scanning at different positions is proportional to different cross-section areas of the film at said positions. The light source of the scanner 148 can be a laser beam with short wavelength or others. Since the present embodiment is directed to detect the absorption of the particles instead of an interference phenomenon, the light source is not limited. As long as the sensor 144 detects the variation in the absorption, any light can be used as the light source of the scanner 148.

In addition, the scanner 148 includes the array light source 148a performing the scanning within a small range, such that the flux on every portion of the wafer can be obtained. In one embodiment, the scanner 148 is arranged in the two-dimensional array in both the X and the Y directions. Through the absorption obtained by performing the scanning in said two directions, the absorption of the particles on every portion of the wafer 110 can be observed to a more accurate extent.

The absorption obtained at different positions can be represented by depicting the relation between the wafer position and the absorption as shown in FIG. 6, and the real-time uniformity data is acquired. In the present embodiment, the function of the wafer position and the absorption is the acquired real-time uniformity data in FIG. 6.

A simulation calculation of the function of the wafer position and the absorption provided in FIG. 6 is further described hereinafter.

Figure 7A:
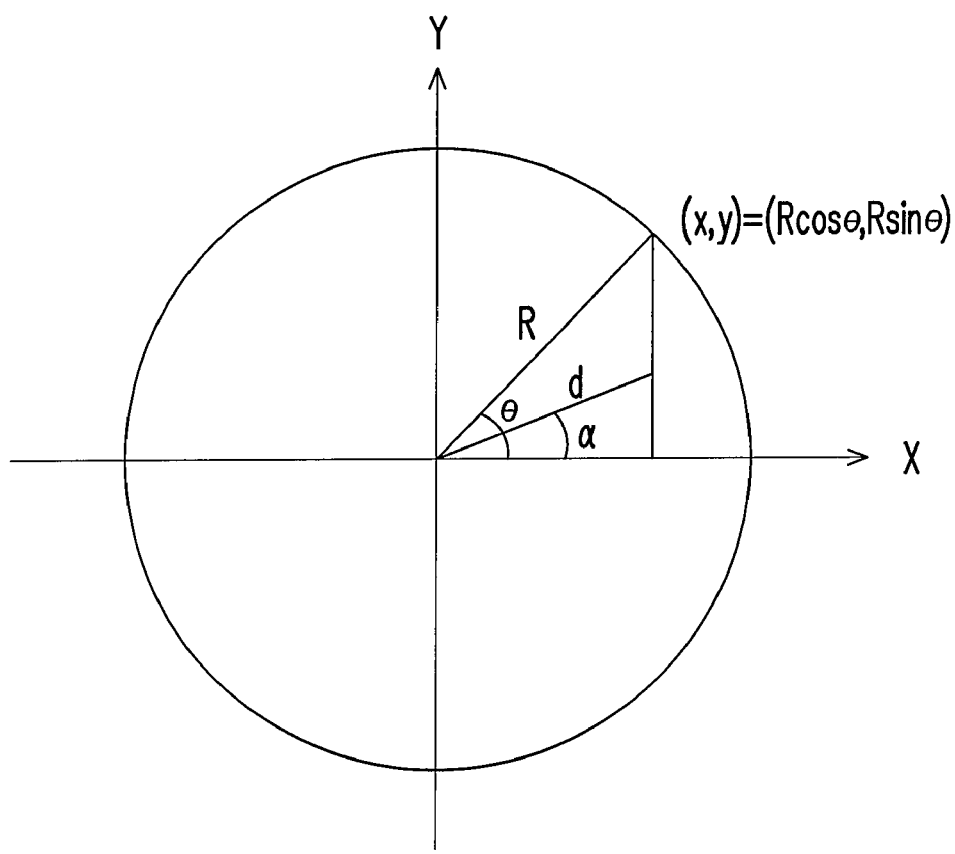
FIGS. 7A-7D are schematic views depicting a simulation calculation according to an embodiment of the present invention.
Figure 7B:
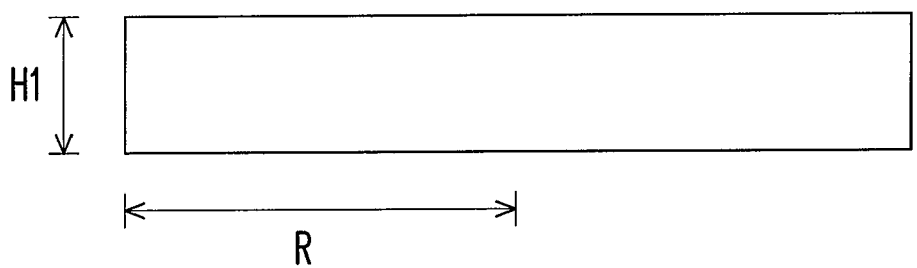

Please refer to FIGS. 7A and 7B. R is a radius of the wafer. Given that the thickness of the film is homogeneous, the thickness Z at each point on the film equals H1 and HR (Z=H1=HR). Here, H is a constant e.g. a ratio between a predetermined thickness of the film and the wafer size. The absorption depends on the cross-section areas of the film. The cross-section area A of the film at different positions x can be represented by the following equation:

$$A = 2Y \times Z = 2R \sin\theta \times HR = 2HR^2 \sin\theta$$

Figure 7C:
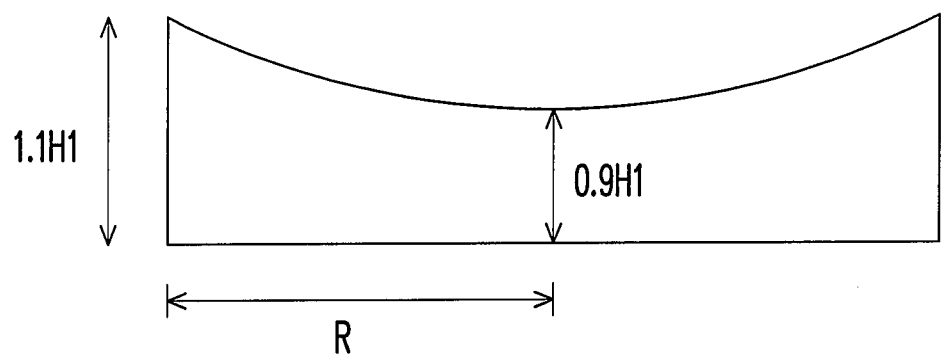

Please refer to FIG. 7C. Given that the film has a dish-like shape i.e. with a concave section in the middle, the thickness Z at each point on the film equals $H2+kd^2$ ($Z=H2+kd^2$). Here, H2 is the thickness at the central point. In the event that the edge-central deviation ratio U% is 10%, the thickness H2 of the central point equals 0.9 H1 and 0.9 HR (H2=0.9 H1=0.9 HR), and the thickness at the edge is 1.1 H1, k=0.2 H/R, $d^2 = x^2 + (R\sin\alpha)^2 = R^2\cos^2\theta + R^2\sin^2\alpha$. The cross-section area B of the dish-like film at different positions x can be represented by the following equation:

$$B = 2\int Z(\alpha) dy$$

$$= 2\int_0^\theta RZ(\alpha) d\sin\alpha$$

$$= 2\int_0^\theta R\left(0.9\,HR + \frac{0.2\,H}{R}(R^2\cos^2\theta + R^2\sin^2\alpha)\right) d\sin\alpha$$

$$= HR^2 \sin\theta\left(\frac{6.2}{3} + \frac{0.4}{3}\cos^2\theta\right)$$

Figure 7D:
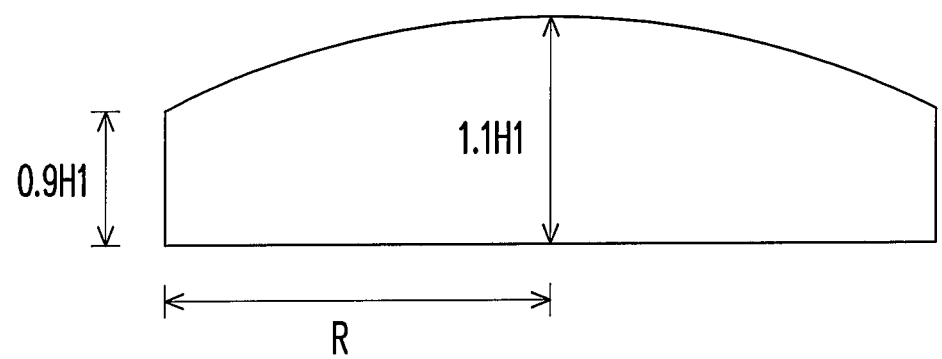

Please refer to FIG. 7D. Given that the film has a central-high shape i.e. with a convex section in the middle, the thickness Z at each point on the film equals $H3-kd^2$ ($Z=H3-kd^2$). Here, H3 is the thickness at the central point. In the event that the edge-central deviation ratio U% is 10%, the thickness H3 of the central point equals 1.1 H1 and 1.1 HR (H3=1.1 H1=1.1 HR), and the thickness at the edge is 0.9 H1, k=0.2 H/R, $d^2=x^2+(R\sin\alpha)^2=R^2\cos^2\theta+R^2\sin^2\alpha$. The cross-section area C of the central-high film at different positions x can be represented by the following equation:

$$C = 2\int Z(\alpha)dy$$
$$= 2\int_0^\theta RZ(\alpha)d\sin\alpha$$
$$= 2\int_0^\theta R\left(1.1\,HR - \frac{0.2\,H}{R}(R^2\cos^2\theta + R^2\sin^2\alpha)\right)d\sin\alpha$$
$$= HR^2\sin\theta\left(\frac{5.8}{3} - \frac{0.4}{3}\cos^2\theta\right)$$

From the proportional relationship among the cross section areas A, B, and C, it can be obtained that the ratio of curves 610, 620, and 630 merely relates to the positions but not to the predetermined thickness (H1=HR) of the film or to the wafer size R. In other words, said calculations can be applied to the relation between the wafer position and the absorption in FIG. 6 no matter what the film thickness or the wafer size is. According to the predetermined thickness and uniformity of the film, the function of the wafer position and the absorption can be calculated, such that a diagram similar to FIG. 6 can be made as the reference uniformity data.

Next, the data processing program is executed to compare the real-time uniformity data and the reference uniformity data (S120). If there is a discrepancy between the real-time uniformity data and the reference uniformity data, a feedback signal is outputted to the PVD apparatus so as to adjust the process parameter thereof (S130).

For example, given that the function of the wafer position and the absorption detected by the monitoring device is the same as the curve 630 in FIG. 6, the film then has the central-high shape with the convex session in the middle. However, the reference uniformity data of the predetermined film is used to adjust the film to a uniform level, as indicated by the curve 610. Thus, a curve-fitting is performed after comparing the real-time uniformity data and the reference uniformity data. Then, the feedback signal is outputted to the PVD apparatus, such that the distribution of the flux of the particles is altered through adjusting the distribution of the plasma density. Thereby, film uniformity is controlled and adjusted to the preset condition as indicated in the predetermined curve 610.

A method of adjusting the plasma density includes, for example, adjusting an operating parameter of each units. Taking the ionized PVD apparatus of FIG. 1 for an example, the feedback signal is transmitted to the magnetic coil 115 to adjust the parameter thereof. Through the change of the magnetic field strength or of the distribution in the reaction chamber, the plasma energy or the plasma density can be adjusted. Taking the double-ring electromagnetic controlling system of FIG. 4 for an example, the feedback signal is transmitted to the double-ring electromagnetic controlling system 105. Thereafter, through an adjustment of the outer electromagnetic system 105*a* and the inner electromagnetic system 105*b*, the difference of the magnetic field in the middle and at sides is adjusted, thus leading to a change of plasma density and to an adjustment of film uniformity.

Said method of applying the real-time system for monitoring and controlling film uniformity is capable of accurately measuring the thickness of the film on every portion of the wafer during the PVD process, of comparing the measured data and the reference data, and of outputting the feedback signal to the PVD apparatus to adjust the process parameter thereof. Thereby, the monitoring and controlling of the film profile can be accomplished in real time. In addition, said method is easily performed and facilitates the choice of light sources.

Moreover, accurate controlling of film uniformity and the film profile is conducive to the subsequent CMP process or the photolithographic and etching process and to the reduction of target consumption.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A real-time system for monitoring and controlling film uniformity, the system being adapted to a physical vapor deposition (PVD) apparatus including a reaction chamber and a wafer stage used to carry a wafer, the system comprising:

a shielding plate, disposed on an inner wall of the reaction chamber above the wafer stage, wherein an opening in the center of the shielding plate exposes the wafer, and particles generated by the PVD apparatus pass through the opening and form a film on the wafer;

a monitoring device, including a scanner and a sensor which are disposed on opposite sidewalls of the reaction chamber between the shielding plate and the wafer stage, the monitoring device being used to measure the flux of the particles on every portion of the wafer so as to acquire real-time uniformity data including a function of the wafer position and the flux; and a data processing program for comparing the real-time uniformity data and reference uniformity data and outputting a feedback signal to the PVD apparatus to adjust the process parameter thereof.

2. The real-time system for monitoring and controlling film uniformity as claimed in claim 1, wherein the sensor detects absorption of the particles such that the flux is measured.

3. The real-time system for monitoring and controlling film uniformity as claimed in claim 2, wherein the real-time uniformity data comprise a function of the wafer position and the absorption.

4. The real-time system for monitoring and controlling film uniformity as claimed in claim 1, wherein the scanner moves along a horizontal direction parallel to the wafer surface.

5. The real-time system for monitoring and controlling film uniformity as claimed in claim 1, wherein the scanner comprises an array light source.

6. The real-time system for monitoring and controlling film uniformity as claimed in claim 1, wherein the monitoring device is arranged in a two-dimensional array and is disposed on a horizontal surface parallel to the wafer surface.

7. The real-time system for monitoring and controlling film uniformity as claimed in claim 1, wherein the scanner outputs a collimated ray beam.

8. The real-time system for monitoring and controlling film uniformity as claimed in claim 1, wherein the shielding plate shields the particles which are not deposited on the wafer.

9. The real-time system for monitoring and controlling film uniformity as claimed in claim 1, wherein the PVD apparatus comprises a double-ring electromagnetic controlling system.

10. The real-time system for monitoring and controlling film uniformity as claimed in claim 1, wherein the PVD apparatus comprises a magnetic coil.

11. A method of applying the real-time system for monitoring and controlling film uniformity as claimed in claim 1, the method being adapted to the PVD process, the method comprising:
synchronically measuring the flux of the particles on every portion of the wafer with use of the real-time system for monitoring and controlling film uniformity and obtaining the real-time uniformity data;
executing the data processing program for comparing the real-time uniformity data and the reference uniformity data; and
outputting the feedback signal to the PVD apparatus to adjust the process parameter thereof.

12. The method of applying the real-time system for monitoring and controlling film uniformity as claimed in claim 11, wherein the method of measuring the flux of the particles comprises:
outputting a ray beam passing through the particles from the scanner; and
detecting the absorption of the particles from the sensor to measure the flux.

13. The method of applying the real-time system for monitoring and controlling film uniformity as claimed in claim 12, wherein the real-time uniformity data comprise the function of the wafer position and the absorption.

14. The method of applying the real-time system for monitoring and controlling film uniformity as claimed in claim 11, further comprising initiating a relative motion between the scanner and the wafer along a horizontal direction, the horizontal direction being parallel to the wafer surface.

15. The method of applying the real-time system for monitoring and controlling film uniformity as claimed in claim 11, wherein the scanner comprises an array light source.

16. The method of applying the real-time system for monitoring and controlling film uniformity as claimed in claim 11, wherein the monitoring device is arranged in a two-dimensional array and is disposed on a horizontal surface parallel to the wafer surface.

17. The method of applying the real-time system for monitoring and controlling film uniformity as claimed in claim 11, wherein the scanner outputs a collimated ray beam.

18. The method of applying the real-time system for monitoring and controlling film uniformity as claimed in claim 11, wherein the shielding plate shields the particles which are not deposited on the wafer during the PVD process.

19. The method of applying the real-time system for monitoring and controlling film uniformity as claimed in claim 11, wherein the PVD apparatus comprises a double-ring electromagnetic controlling system.

20. The method of applying the real-time system for monitoring and controlling film uniformity as claimed in claim 11, wherein the process parameter of the PVD apparatus is adjusted so as to adjust the flux of the particles on every portion of the wafer.

* * * * *